(12) United States Patent
Ivanchenko et al.

(10) Patent No.: US 8,538,130 B2
(45) Date of Patent: Sep. 17, 2013

(54) CD METROLOGY SYSTEM AND METHOD OF CLASSIFYING SIMILAR STRUCTURAL ELEMENTS

(75) Inventors: Yan Ivanchenko, Nes-Tziona (IL); Adi Costa, Kfar Sava (IL)

(73) Assignee: Applied Materials Israel, Ltd., Rehovot (IL)

( * ) Notice: Subject to any disclaimer, the term of this patent is extended or adjusted under 35 U.S.C. 154(b) by 14 days.

(21) Appl. No.: 13/224,237

(22) Filed: Sep. 1, 2011

(65) Prior Publication Data

US 2012/0076393 A1    Mar. 29, 2012

Related U.S. Application Data

(63) Continuation of application No. PCT/IL2010/000170, filed on Mar. 2, 2010.

(60) Provisional application No. 61/156,802, filed on Mar. 2, 2009.

(51) Int. Cl.
*G06K 9/00*    (2006.01)

(52) U.S. Cl.
USPC .......................................... 382/144; 382/145

(58) Field of Classification Search
None
See application file for complete search history.

(56) References Cited

U.S. PATENT DOCUMENTS

| | | | | |
|---|---|---|---|---|
| 6,480,627 B1* | 11/2002 | Mathias et al. | ............... | 382/224 |
| 7,596,423 B2* | 9/2009 | Winkler et al. | ............... | 700/121 |
| 7,970,198 B2* | 6/2011 | Park | ............................. | 382/144 |
| 8,148,682 B2* | 4/2012 | Hotta et al. | .................... | 250/307 |
| 2004/0040930 A1 | 3/2004 | Tanaka et al. | | |
| 2007/0105243 A1 | 5/2007 | Nagatomo et al. | | |
| 2008/0169862 A1 | 7/2008 | Park et al. | | |
| 2009/0136116 A1* | 5/2009 | Okai et al. | .................... | 382/144 |
| 2009/0142926 A1 | 6/2009 | Dai et al. | | |
| 2010/0009470 A1 | 1/2010 | Davis et al. | | |

OTHER PUBLICATIONS

Applied Materials Israel, Ltd.; PCT/IL2010/000170 filed Mar. 2, 2010; International Search Report and Written Opinion; ISA/EP; Jul. 5, 2010; 11 pages.
Applied Materials Israel, Ltd.; PCT/IL2010/000170 filed Mar. 2, 2010; International Preliminary Report on Patentability; IPEA/EP; May 20, 2011; 9 pages.
Arnold W H et al.; "Metrology challenges for double exposure and double patterning" Proceedings of the SPIE; vol. 6518, 2007, pp. 651802-1-651802-13; XP040238890Bellingham, US ISSN: 0277-786.

* cited by examiner

*Primary Examiner* — Barry Drennan
(74) *Attorney, Agent, or Firm* — Kilpatrick Townsend & Stockton LLP (57) ABSTRACT

A CD metrology system and method of classifying similar structural elements. The method includes: a) obtaining an image of the semiconductor structure; b) identifying sufficient numbers of structural elements belonging to first and second groups of similar structural elements, each group originating from a different manufacturing stage; c) assessing to each given structural element within the sufficient numbers of structural elements belonging to the first and second groups, one or more features indicative of a respective manufacturing stage, wherein values of the respective features are derived from the obtained image and; d) using results of the assessment for a classification decision related to manufacturing stages and, respectively, originating therefrom structural elements in the first and second groups of similar structural elements.

22 Claims, 10 Drawing Sheets

CD METROLOGY SYSTEM AND METHOD OF CLASSIFYING SIMILAR STRUCTURAL ELEMENTS

CROSS-REFERENCES TO RELATED APPLICATIONS

This application is a CONTINUATION, filed under 35 U.S.C. 111(a), 363, 365(c) and 120, of PCT application No. PCT/IL2010/000170, filed Mar. 2, 2010, which claims priority to U.S. Provisional Patent Application No. 61/156,802, filed Mar. 2, 2009, each of which is incorporated herein by reference in its entireties.

FIELD OF THE INVENTION

The present invention relates, in general, to methods and systems enabling control of the semiconductor manufacturing process and, more particularly, to methods and systems for critical dimension (CD) metrology in a multi-layered patterning manufacturing process.

BACKGROUND

Emerging multiple-patterning high-density techniques require increased precision in evaluating the multi-layered patterns formed on a wafer. By way of non-limiting example, such techniques include self-aligned double patterning (SADP), double-exposure double patterning, and the like, used for creating high-density arrays of parallel lines as, for example, in the case of 32 nm and 22 nm flash memory structures.

The evaluation of such patterns may be provided by means of CD metrology, which may include recognition of structural elements, measuring, calibration, inspection, analyses, reporting, and/or other procedures necessary for assessing dimensions, sidewalls shape, line edge roughness, and/or other characteristics of patterns and structural elements thereof. The obtained results may be used for evaluating parameters and/or conditions of respective stages of manufacturing processes and providing necessary feedback.

CD metrology may be provided with the help of a variety of tools based on non-destructive observations as, by way of non-limiting example, scanning microscopes, atomic force microscopes, optical inspection tools, and others.

The problems of CD metrology for high-density manufacturing processes have been recognized in the Prior Art and various systems have been developed to provide solutions, for example:

US Patent Application No. 2010/009470 (Davis et al.) discloses an apparatus for adaptive self-aligned dual patterning and a method thereof. The method includes providing a substrate to a processing platform configured to perform an etch process and a deposition process and a metrology unit configured for in-vacuo CD measurement. The in-vacuo CD measurement is utilized for feedforward adaptive control of the process sequence processing platform or for feedback and feedforward adaptive control of chamber process parameters. In one aspect, a first layer of a multi-layered masking stack is etched to form a template mask, an in-vacuo CD measurement of the template mask is made, and a spacer is formed, adjacent to the template mask, to a width that is dependent on the CD measurement of the template mask.

US Patent Application 2009/142926 (Dai et al.) discloses several embodiments related to lithographic processes and used for improving line edge roughness (LER) and reduced CDs for lines and/or trenches. Embodiments use the combinations of polarized light lithography, shrink coating processes, and double exposure processes to produce synergetic effects in the formation of trench structures having good resolution, reduced CDs, reduced pitch, and reduced LER in the lines and/or trenches of the patterned interconnect structures. The embodiments may further include measuring the CDs and/or the LER prior to a second application of a shrink coating.

US Patent Application No. 2008/169862A (Park et al.) discloses a method for controlling patterns formed by a double patterning process including control of characteristics controlled responsive to CDs of the patterns. The method includes controlling two or more patterns having different CDs to optimally operate the patterns. The patterns may be individually controlled by signals provided to the patterns on the basis of the pattern's CDs. The signals may be controlled by controlling the magnitudes or the application time of the signals provided to the respective patterns.

US Patent Application No. 2007/105243 (Nagatomo et al.) discloses a method and apparatus for estimation of cross-sectional shape of a pattern. In an exposure process or etching process, an image feature amount, useful for estimating a cross-sectional shape of a target evaluation pattern, process conditions for the pattern, or device characteristics of the pattern, is calculated from an SEM image. The image feature amount is compared with learning data that correlates data preliminarily stored in a database, which includes cross-sectional shapes of patterns, process conditions for the patterns, or device characteristics of the patterns, to the image feature amount calculated from the SEM image. Thereby, the cross-sectional shape of the target evaluation pattern, the process conditions of the pattern, or the device characteristics of the pattern, are nondestructively calculated.

US Patent Application No. 2004/040930 (Tanaka et al.) discloses a method for quantitatively evaluating a three-dimensional shape of an etched pattern. Variations in signal amounts of an SEM image are utilized to compute three-dimensional shape data on the pattern associated with the etching process steps. Further provided is determination of etching process conditions and process control, based on obtained three-dimensional shape data.

SUMMARY OF THE INVENTION

In multi-layered patterning techniques some similar structural elements may originate from different stages of the manufacturing process. By way of non-limiting example, such structural elements may be core/gap spaces and/or opposite edges of given lines and/or odd and even lines in the double patterning manufacturing process, etc. As dimensions and/or shapes of such structural elements are regulated by different manufacturing parameters at respective manufacturing stages, proper adjustment of manufacturing parameters needs to be provided with the help of metrology capable of distinguishing between structural elements stemming from different origins.

In accordance with certain aspects of the present invention, there is provided a computerized method of recognizing core spaces and gap spaces, the method for use with a double patterning manufacturing semiconductor structure comprising a plurality of periodic lines and a plurality of periodic spaces therebetween, the plurality of spaces comprising core spaces and gap spaces. The method comprises: a) obtaining an image of the semiconductor structure; b) identifying a sufficient number of odd spaces and of even spaces; c) assessing for each given space within the sufficient number of spaces, one or more features, wherein the values of the features are derived from the obtained image and are indicative of one or more characteristics of spaces related to respective manufacturing stages; and d) using the assessment results for recognizing odd spaces as core spaces or gap spaces and, respectively, recognizing even spaces as gap spaces or core spaces.

In accordance with other aspects of the present invention, there is provided a computerized method of classifying the similar structural elements, the method for use in conjunction with critical dimensions metrology of a semiconductor structure comprising a plurality of similar structural elements, the plurality of similar structural elements comprising at least a first group and a second group of similar structural elements, each group originating from a different manufacturing stage. The method comprises: a) obtaining an image of the semiconductor structure; b) identifying a sufficient number of structural elements belonging to the first group and a sufficient number of structural elements belonging to the second group; c) assessing for each given structural element within the sufficient number of elements in the first group and in the second group one or more features indicative of the respective manufacturing stage, wherein values of the respective features are derived from the obtained image, thus giving rise to assessment results and; d) using the assessment results for a classification decision related to manufacturing stages and respectively originating therefrom structural elements in the first group and in the second group of similar structural elements.

In accordance with other aspects of the present invention, there is provided a CD-metrology system comprising an image unit operatively coupled to a processing unit. The image unit is configured to obtain an image of a semiconductor structure comprising a plurality of similar structural elements, said plurality of similar structural elements comprising at least a first group and a second group of similar structural elements, each group originating from a different manufacturing stage. The processing unit is configured i) to identify a sufficient number of structural elements belonging to the first group and sufficient number of structural elements belonging to the second group; ii) to assess for each given structural element within the sufficient number of elements in the first group and in the second group, one or more features indicative of respective manufacturing stage, wherein values of the respective features are derived from the obtained image and; iii) to use the results of assessment for a classification decision related to manufacturing stages and respectively originating therefrom structural elements in the first group and in the second group of similar structural elements.

In accordance with further aspects of the present invention, the first group of similar structural elements may be odd spaces and the second group of similar structural elements may be even spaces formed between periodic lines in a line-patterned structure, wherein odd spaces and even spaces originate from different manufacturing stages. The odd spaces and even spaces may originate from etching different materials in a double patterning manufacturing process. Additionally or alternatively, the similar structural elements may be edges of one or more given lines within a plurality of periodic lines in a line-patterned structure, wherein edges of any given line originate from different manufacturing stages. Opposite edges of any given line may originate from different structure interfaces obtained in a double patterning manufacturing process. Additionally or alternatively, the first group of similar structural elements may be odd lines and the second group of similar structural elements may be even lines in a line-patterned structure, wherein odd lines and even lines originate from different manufacturing stages in a double-exposure double patterning manufacturing process.

In accordance with further aspects of the present invention, for a line-patterned structure comprising a plurality of periodic lines and a plurality of periodic spaces therebetween, the features indicative of the respective manufacturing stage are characterized by one or more parameters selected from a group comprising: average space brightness, absolute brightness of one or more edges of lines adjacent to the space, relative brightness of one or more edges of lines adjacent to the space, average brightness of one or more edges of lines adjacent to the space, width of one or more edges of lines adjacent to the space, the ratio between brightness and width, shape of edges descriptors, edge profile roughness, and combinations thereof.

In accordance with further aspects of the present invention, the CD metrology system may operate in a learn manufacturing mode and a run manufacturing mode. The learn manufacturing mode may comprise obtaining a sample image corresponding to a certain manufacturing stage; and selecting from among said features a feature enabling the highest distinctiveness; the feature to be used for assessing similar structural elements at corresponding manufacturing stages in the run manufacturing mode.

In accordance with further aspects of the present invention, one or more assessed features may be selected in accordance with the manufacturing stage corresponding to the obtained image.

In accordance with further aspects of the present invention, values for assessing the one or more features indicative of a respective manufacturing stage may be derived from a one-dimensional profile indicative of one or more parameters of the semiconductor structure and derived from the obtained image.

In accordance with further aspects of the present invention, for a line-patterned structure comprising a plurality of periodic lines and a plurality of periodic spaces therebetween, assessing the one or more features to a given space may comprise calculating, respectively, one or more pairs of values, a first value in the pair characterizing the line to the left of the given space and a second value in the pair characterizing the line to the right of the given space.

In accordance with other aspects of the present invention there is provided a CD metrology system comprising an image unit operatively coupled to a processing unit. The image unit is configured to obtain an image of a semiconductor structure comprising a plurality of periodic lines and a plurality of periodic spaces therebetween, the plurality of spaces comprising core spaces and gap spaces. The processing unit is configured: i) to identify a sufficient number of odd spaces and of even spaces; ii) to assess to each given space within the sufficient number of spaces one or more features, wherein the values of the features are derived from the obtained image and are indicative of one or more characteristics of spaces related to respective manufacturing stages; and to use the assessment results for recognizing odd spaces as core spaces or gap spaces and, respectively, recognizing even spaces as gap spaces or core spaces.

BRIEF DESCRIPTION OF THE DRAWINGS

In order to understand the invention and to see how it may be carried out in practice, embodiments will now be described, by way of non-limiting example only, with reference to the accompanying drawings, in which:

FIG. 4 illustrates a one-dimensional profile generated in accordance with certain embodiments of the present invention and corresponding to the example image illustrated in FIG. 2a;

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention. In the drawings and descriptions, identical reference numerals indicate those components that are common to different embodiments or configurations.

Unless specifically stated otherwise, as apparent from the following discussions, it is appreciated that throughout the specification discussions utilizing terms such as "processing", "computing", "calculating", "identifying", "generating", "evaluating", "classifying", "selecting", "assessing" or the like, refer to the action and/or processes of a computer that manipulate and/or transform data into other data, said data represented as physical, such as electronic, quantities and/or said data representing the physical objects. The term "computer" should be expansively construed to cover any kind of electronic system with data processing capabilities, including, by way of non-limiting example, personal computers, servers, computing systems, communication devices, storage devices, processors (e.g., digital signal processors (DSPs), microcontrollers, field programmable gate arrays (FPGAs), application specific integrated circuits (ASICs), etc.) and other electronic computing systems.

The operations in accordance with the teachings herein may be performed by a computer specially constructed for the desired purposes or by a general purpose computer specially configured for the desired purpose by a computer program stored in a computer-readable storage medium Embodiments of the present invention are not described with reference to any particular programming language. It will be appreciated that a variety of programming languages may be used to implement the teachings of the inventions as described herein.

The references cited in the background teach many principles of CD metrology that are applicable to the present invention. Therefore the full contents of these publications are incorporated by reference herein for appropriate teachings of additional or alternative details, features and/or technical background.

Figure 1:
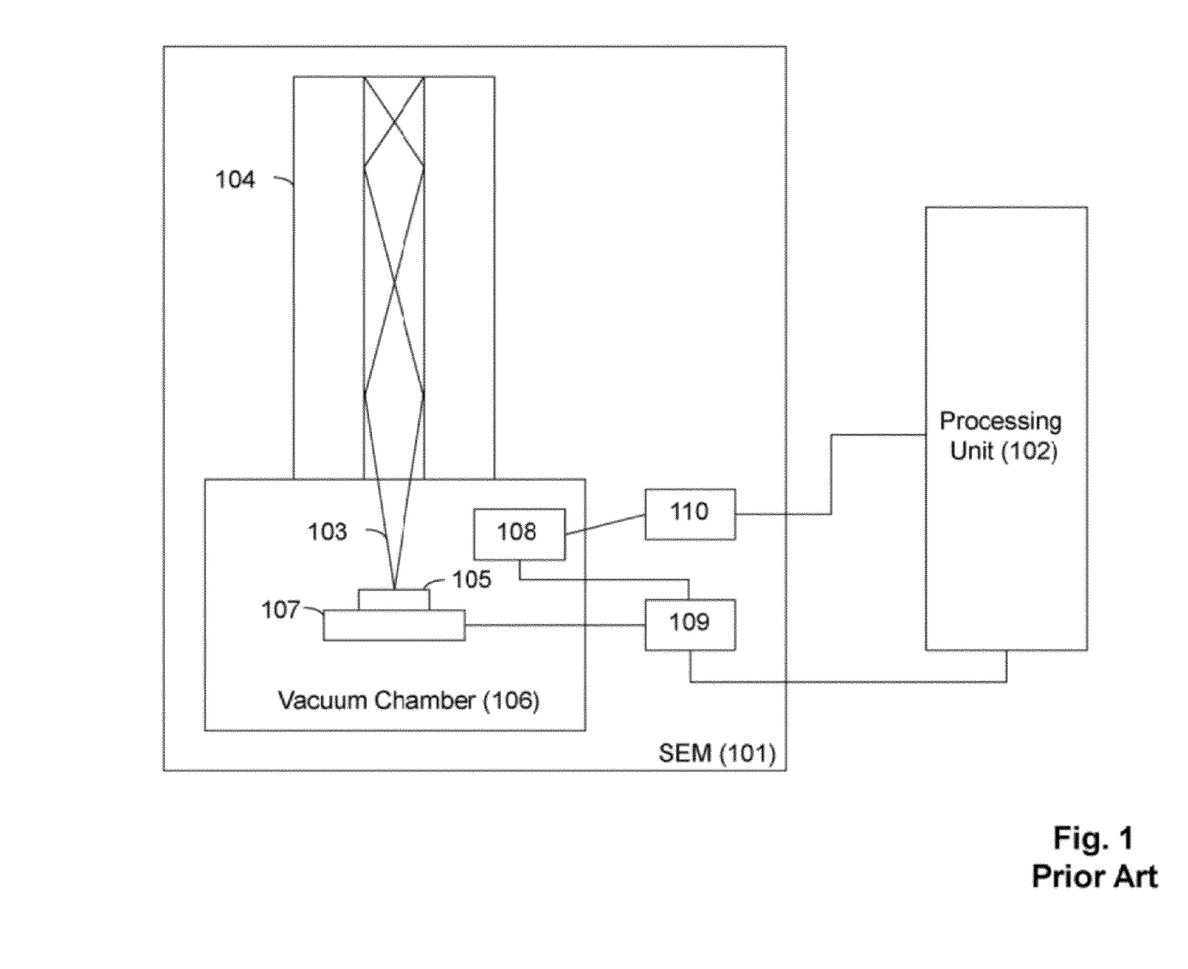
FIG. 1 illustrates a schematic functional diagram of CD-metrology system as known in the art.

Bearing this in mind, attention is drawn to FIG. 1 illustrating a schematic functional block diagram of an exemplary CD metrology system as known in the art. The metrology system illustrated in FIG. 1 comprises a scanning electron microscope (SEM) 101 and a processing unit 102. The SEM uses a beam 103 of electrons which is shaped and focused by magnetic and electrostatic "lenses" (not shown) within an electron column 104. The lens system is designed to control the trajectory and focal length of the beam 103 so that the electron beam is focused on a semiconductor structure 105 placed in a vacuum sample chamber 106. The vacuum sample chamber 106 further comprises an X-Y stage 107 and a secondary electron detector 108. The X-Y stage is adapted to move in an optional direction on the X-Y plane responsive to a control signal received from a control unit 109. The secondary electron detector 108 is adapted to detect secondary electrons, reflected electrons and/or back scattered electrons emitted from the surface of the structure 105 irradiated with the electron beam 103, and to provide the detected results to an image processing unit 110. The image processing unit is configured to receive the detected results of the secondary electron detector and to process the received data thus providing an SEM image. The obtained SEM image is sent to the processing unit 102 for further analyses, deriving metrology data and storing the SEM image and/or derivatives thereof. Optionally the control unit 109 may be further operatively coupled to the secondary electron detector 108 and the processing unit 102. The processing unit may be further configured to provide instructions to the control unit 109 with regard to positioning and/or other parameters related to SEM operating, the instructions resulting from analyzing the received and/or stored images.

Certain embodiments of the present invention are applicable to the CD metrology system described with reference to FIG. 1. However, the invention is not bound by the specific system; equivalent and/or modified functionality may be consolidated or divided in another manner and may be implemented in any appropriate combination of software, firmware and hardware. For purpose of illustration only, the following description is made with respect to SEM images. Those versed in the art will readily appreciate that the teachings of the present invention are not bound by SEM images and are applicable in a similar manner to top-bottom images of a structure or parts thereof obtained by using differently implemented techniques of electronic microscopy, optical inspection, atomic force microscopy or other suitable techniques. Likewise, the invention may be implemented with the help of a stand alone tool to be used in conjunction with metrology of the semiconductors structures and/or parts thereof.

Figure 2A:
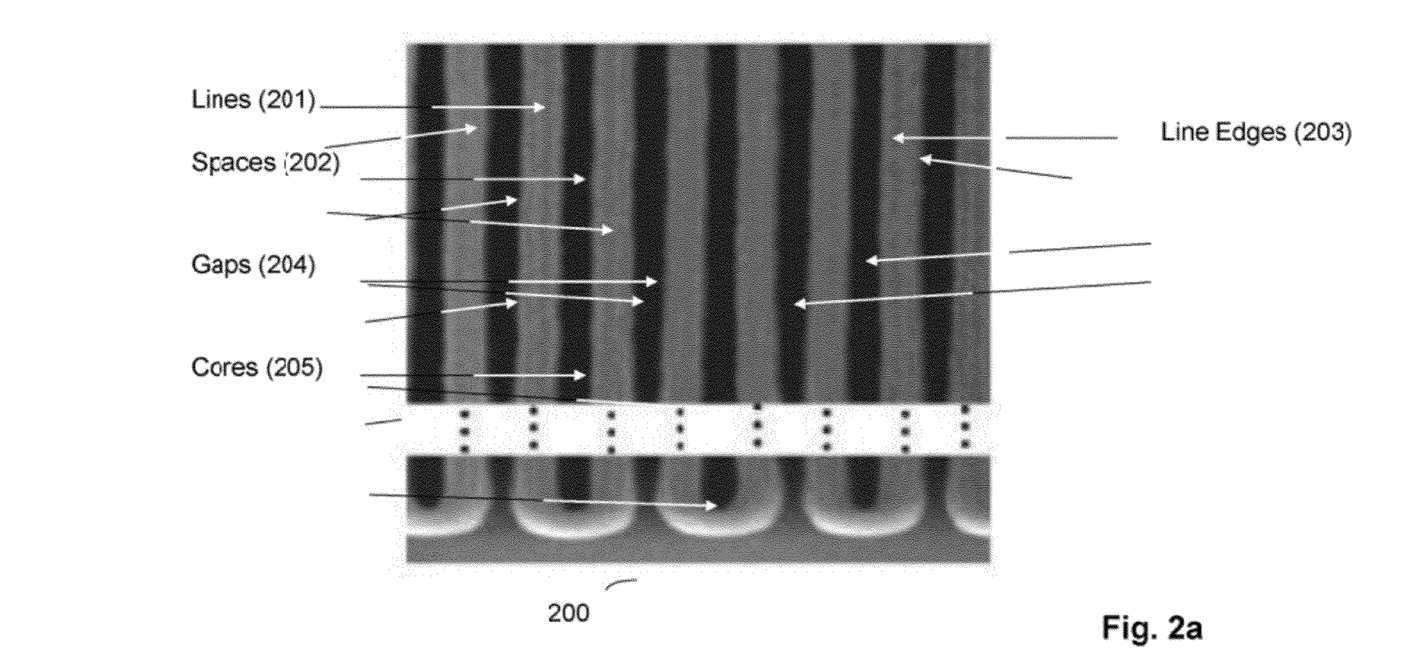
FIG. 2a illustrates an example image of a line-patterned structure obtained with the help of an SEM.

Referring to FIG. 2a, there is illustrated an example of a top-bottom SEM image of a line-patterned structure 200. Unless specifically stated otherwise, the term "image" used in this patent specification should be expansively construed to cover a single frame image received from a single detector as well as an image derived by processing several frames received from one or more detectors. By way of non-limiting example, the processing may be provided for improving SNR, enhancing certain structural elements, etc.

The illustrated structure 200 is obtained during a self-aligned double patterning (SADP) process. Non-limiting examples of certain embodiments of SADP technique are disclosed in US Patent Application No. 2009/246706, and non-limiting examples of certain embodiments of CD-metrology for SADP processes are disclosed US Patent Application No. 2010/009470, both applications assigned to the assignee of the present application and incorporated herein by reference in their entireties.

The structure 200 comprises pluralities of repeating similar structural elements (e.g., a plurality of periodic lines 201, a plurality of periodic spaces (trenches) 202 therebetween, and a plurality of periodic line edges 203). The term "similar structural elements" used in this patent specification should be expansively construed to cover structural elements closely resembling each other with the possibility of being mistaken for each other.

For purpose of illustration only the following description is provided with respect to vertical orientation of lines.

Figure 2B:
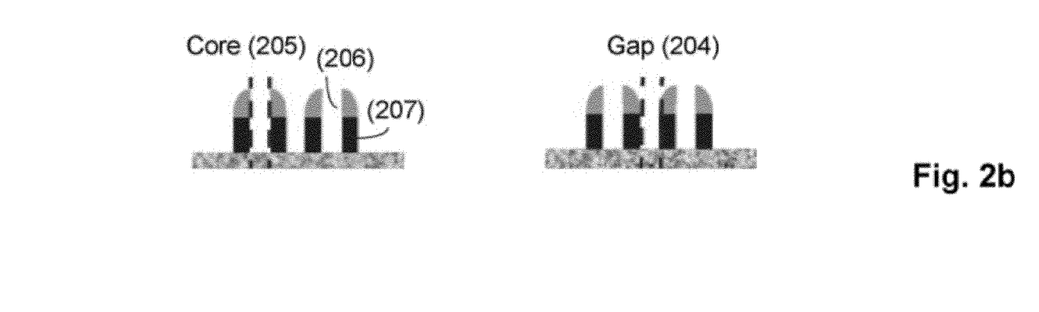
FIG. 2b schematically illustrates core and gap spaces in the example image.
Figure 2C:
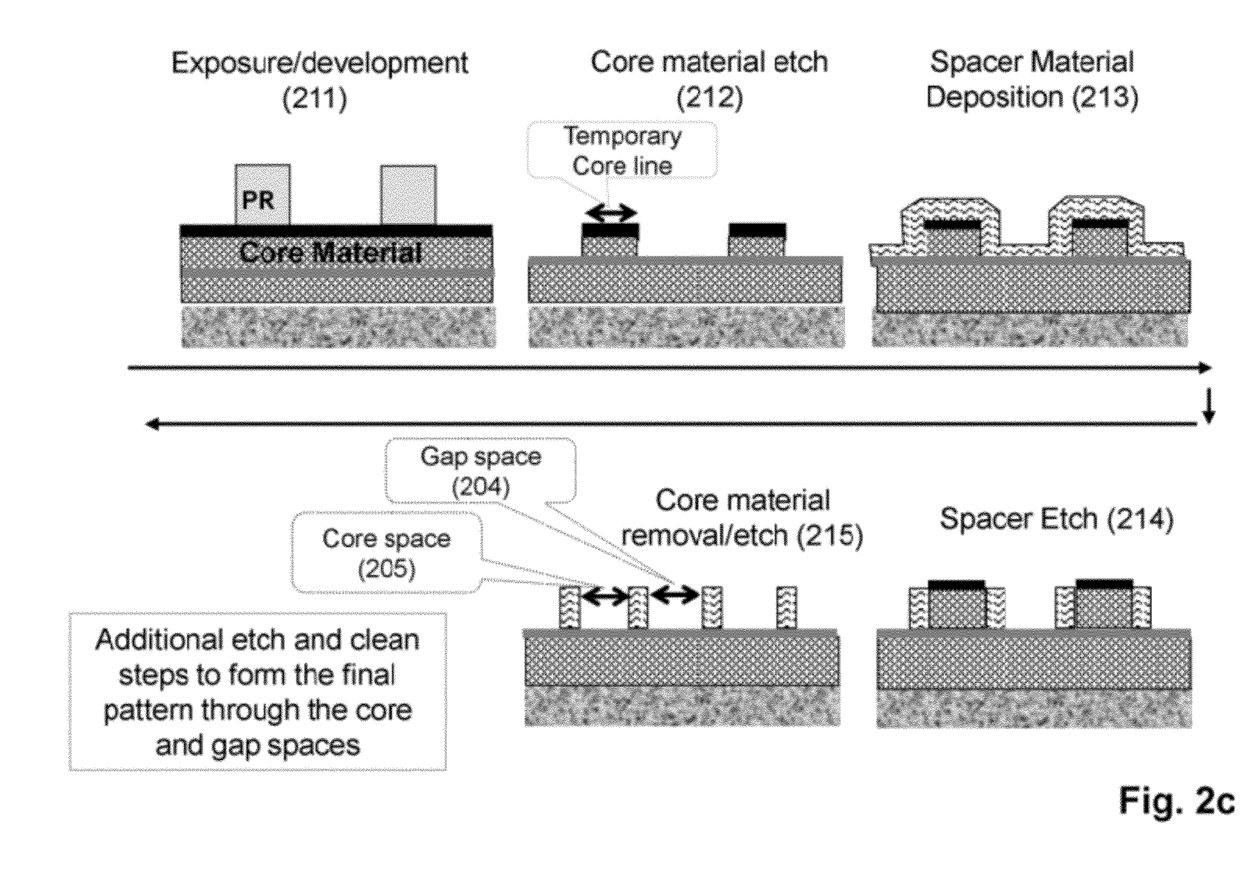
FIG. 2c schematically illustrates a schematic flow of a spacer self-aligned double patterning (SADP) process as known in the art.

FIG. 2c illustrates schematic flow of the spacer-based self-aligned double patterning (SADP) process as known in the art. The illustrated example of the process of creating lines using sidewall spacers includes lithography resist trim (211), core material etch (212), spacer formation (deposition 213 and etch 214), and core material removal (215).

Resulting from the manufacturing process, even and odd spaces (i.e., the two spaces on two sides of any given line) originate from different steps of the manufacturing process. A space resulting from removal of a temporary material (spacer) is referred to hereinafter as a gap space (204), and a space resulting from removal of a core material is referred to hereinafter as a core space (205). Opposite edges of any given line originate from different structure interfaces, namely one edge of a line is defined by the spacer to template interface, while its opposing edge is defined by the sidewall spacer to air interface. Therefore, opposite edges of a line may have different degrees of roughness.

As further schematically illustrated in FIG. 2b, each line has one sharp edge resulting from the core material etching and one slant edge resulting from the spacer etching; left-slant and right-slant lines are repeated periodically in the pattern. Core spaces 205 are located between sharp edges of two lines, and gap spaces 204 are located between slant edges of two lines. As illustrated in FIG. 2a, core trenches and gap trenches are interleaved, i.e. all odd spaces are of one type and all even spaces are of another type.

By way of non-limiting example, CD trim step (212) is performed during the template etch, to achieve a template CD that is ¼ the printed pitch. After forming spacers, each with a sidewall also targeting ¼ the pitch, and stripping the template (215), the two different spaces (on each side of any given line) stem from two different origins. The core space originates from the CD of the template, and the gap space is the balance of the pitch minus the core space and two spacers. Accordingly, the core space and the gap space may differ in the CD if the trim performed during the template etch misses the designed target. By way of non-limiting example, a lack of photoresist trimming will cause the core spaces to be larger than gap spaces, while after excessive photoresist trimming, the gaps will be larger than cores.

Those versed in the art will readily appreciate that possible differences in dimensions and/or shapes of similar structural elements stemming from different origin are not bound by illustrated differences between core/gap spaces and opposite edges of a given line originating from different stages of the SADP process. Likewise, similar structural elements may stem from different origins in other multi-layered patterning techniques. For example, odd and even lines in double-exposure double patterning process originate from different manufacturing stages and may differ in line widths and spacing when the second set of lines (printed lithographically) is not perfectly aligned (centered) with the first set of lines.

Distinguishing between similar structural elements obtained at different manufacturing stages enables proper control and/or metrology-based tuning of respective stages and the entire manufacturing process.

Figure 3:
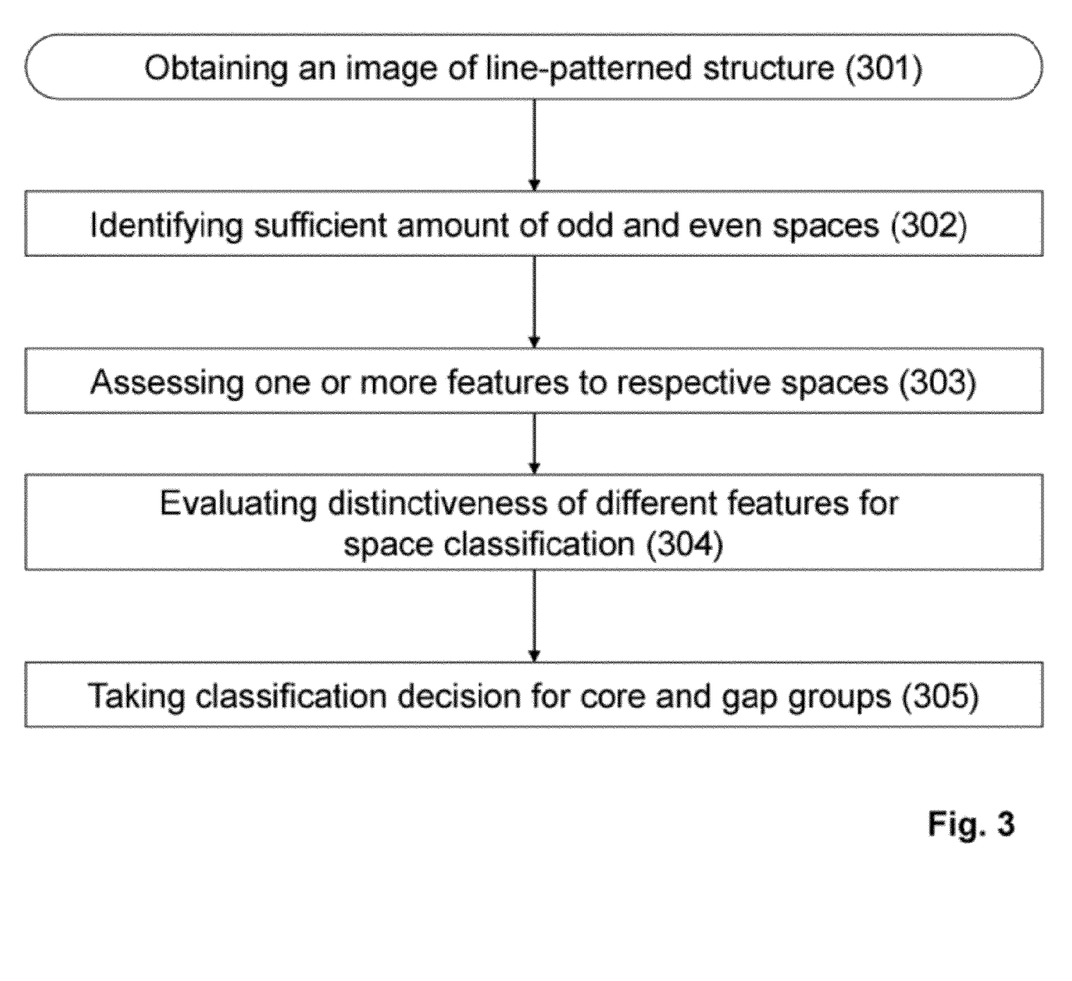
FIG. 3 is a flow-chart for a method of classifying similar structural elements in accordance with certain embodiments of the present invention.
Figure 4:
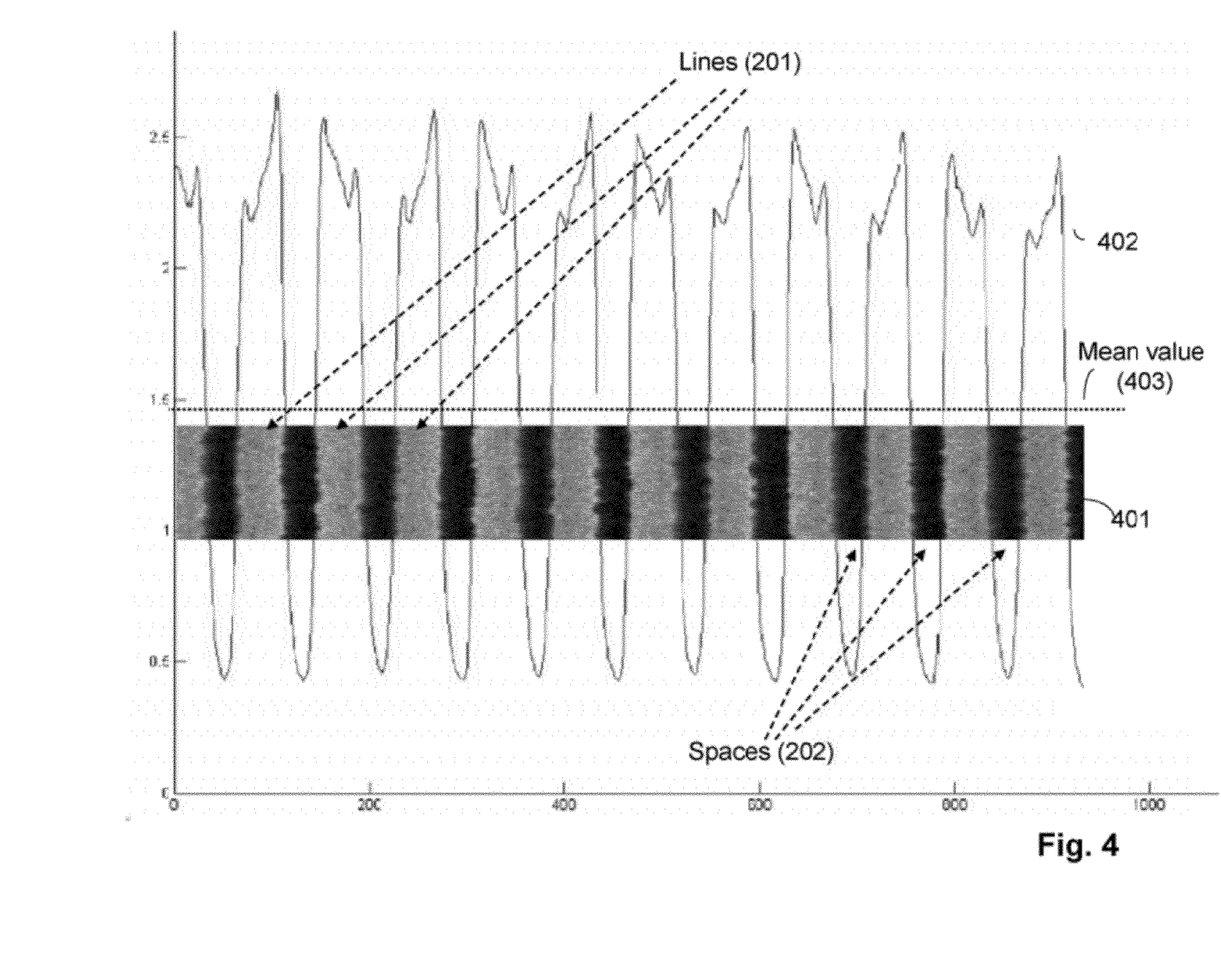

Referring to FIG. 3, there is illustrated a flow chart of a method for classifying similar structural elements in accordance with certain embodiments of the present invention. This classification is provided in conjunction with CD metrology as a preliminary step or as part of a measuring process. A semiconductor structure corresponding to the obtained (301) two-dimensional image comprises a plurality of similar structural elements comprising at least a first group and a second group of similar structural elements, each group originating from different manufacturing stages. The obtained image is processed in order to identify (302) one or more pluralities of similar structural elements and respective groups thereof stemming from different origins. By way of non-limiting example, the two-dimensional image of the line-patterned structure is processed in order to identify a plurality of spaces comprising a group of core spaces and a group of gap spaces. Spaces and lines may be distinguished by analyzing a one-dimensional profile of the obtained image. A one-dimensional profile is generated by assigning to each coordinate on the horizontal axis a value derived from the obtained two-dimensional image and characterizing the column with the respective coordinate. By way of non-limiting example, FIG. 4 illustrates a one-dimensional profile corresponding to the example image illustrated in FIG. 2a. For illustration purposes fragment 401 of the image is overlaid with the one-dimensional profile 402. The values in the illustrated profile are obtained by summing the respective brightness along the vertical direction. Alternatively, the values may characterize average brightness along the columns or another characteristic indicative of differences between lines and spaces. Lines (201) and spaces (202) may be distinguished by differences in respective brightness. For example, mean value 403 characterizing the one-dimensional profile may be used as a threshold for separating the lines and spaces—coordinates with values above the mean value correspond to lines, and coordinates with values below the mean value correspond to spaces.

Referring back to FIG. 3, the process further includes assessing (303) to a substantial number of similar structural elements in each group one or more features indicative of respective manufacturing stages, wherein values of the features are derived from the obtained image. For example, in the line-patterned structure stage-indicative features are assessed for the substantial number of odd and even spaces. Such stage-indicative features include average space brightness; absolute, average or relative brightness of one or more edges of lines adjacent to the space; width of one or more edges of lines adjacent to the space, the ratio between brightness and width, shape of edges descriptors (e.g., minimum, maximum and average of slope), edge profile roughness, combinations thereof, etc. As will be further detailed with reference to FIGS. 5-6, the values of features for a given space are derived from the obtained image, e.g. by analyzing the one-dimensional profile. As the two groups of spaces originate from different manufacturing stages, values of at least some of the stage-indicative features will differ.

In case of a synthetic image, comparing stage-indicative features of two similar structural images may be sufficient for the classification process (e.g., comparing one pair of spaces on two sides of a given line may be sufficient to distinguish between core and gap spaces). However, because of noise, non-even distribution of operating parameters over the wafer and other factors, a real image requires analyses of feature values for the number of similar structural elements sufficient for an accurate (successful) decision, such number is referred to herein after as "sufficient number". For example, for core and gap spaces, the successful decision may be provided by analyzing the statistical distribution of feature values over odd and even spaces. Such analyses may be provided, for example, by comparing the distance between mean or median values with their standard deviations. Further such analyses may also enable evaluation of a certainty of the distinguishing between odd and even spaces.

The distinctiveness of different stage-indicative features with respect to similar structural elements may vary depending, for example, on a certain manufacturing stage, a layer of the manufacturing structure being currently under inspection and/or other metrology parameters. Accordingly, as will be further detailed with reference to FIG. 9, the effectiveness of separating different groups of similar structural elements is evaluated (304) before taking (305) a classification decision (e.g., with regard to manufacturing stages and the respective even and odd spaces originating therefrom).

In certain embodiments of the invention the sufficient number of similar structural elements in a group may be characterized by a predefined threshold parameter (e.g., not less than 3 odd and 3 even spaces). Alternatively or additionally, the threshold parameter for a sufficient number may be configured as an adaptive parameter depending on the effectiveness of separation of the similar structural elements of different origin to different groups. Optionally, the sufficient number may be configured as "all similar structural elements" within a measuring field or a predefined part thereof, or as "all similar structural elements" in the obtained image.

Figure 5:
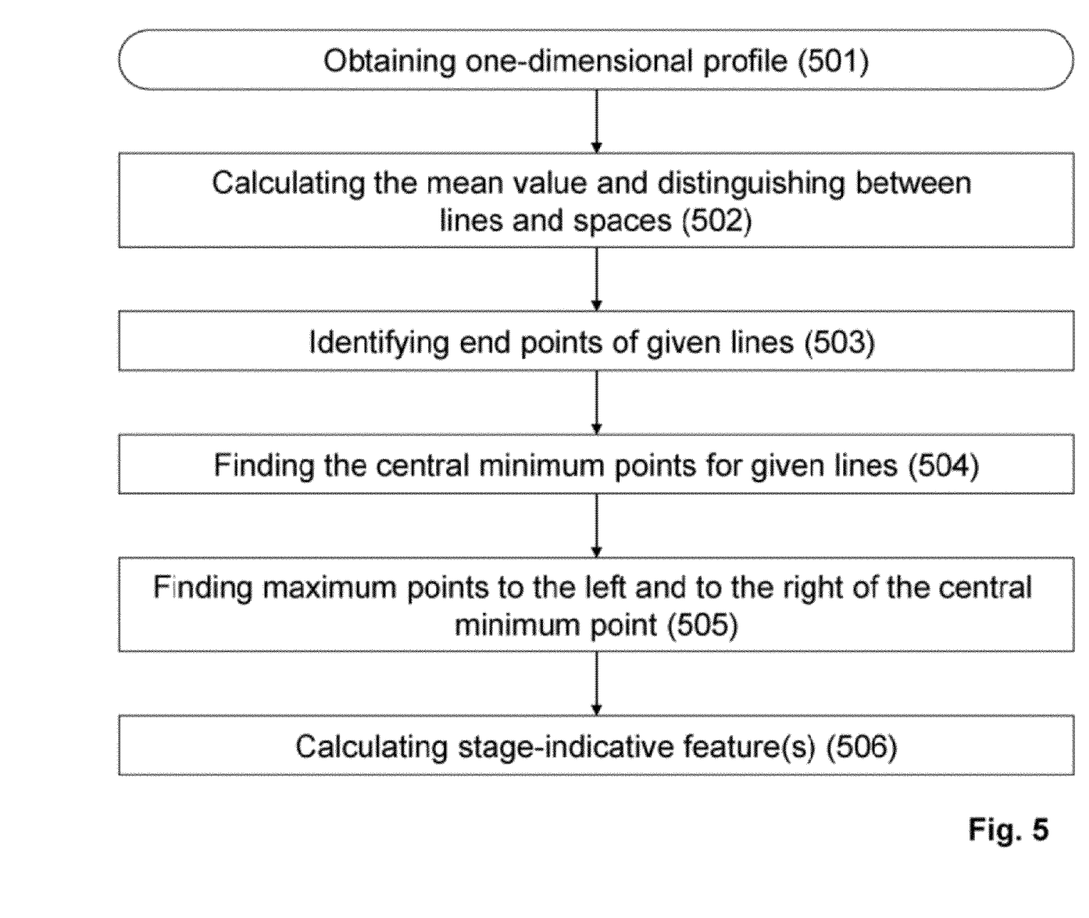
FIG. 5 is a flow-chart for a method of assessing stage-indicative features in accordance with certain embodiments of the present invention.
Figure 6:
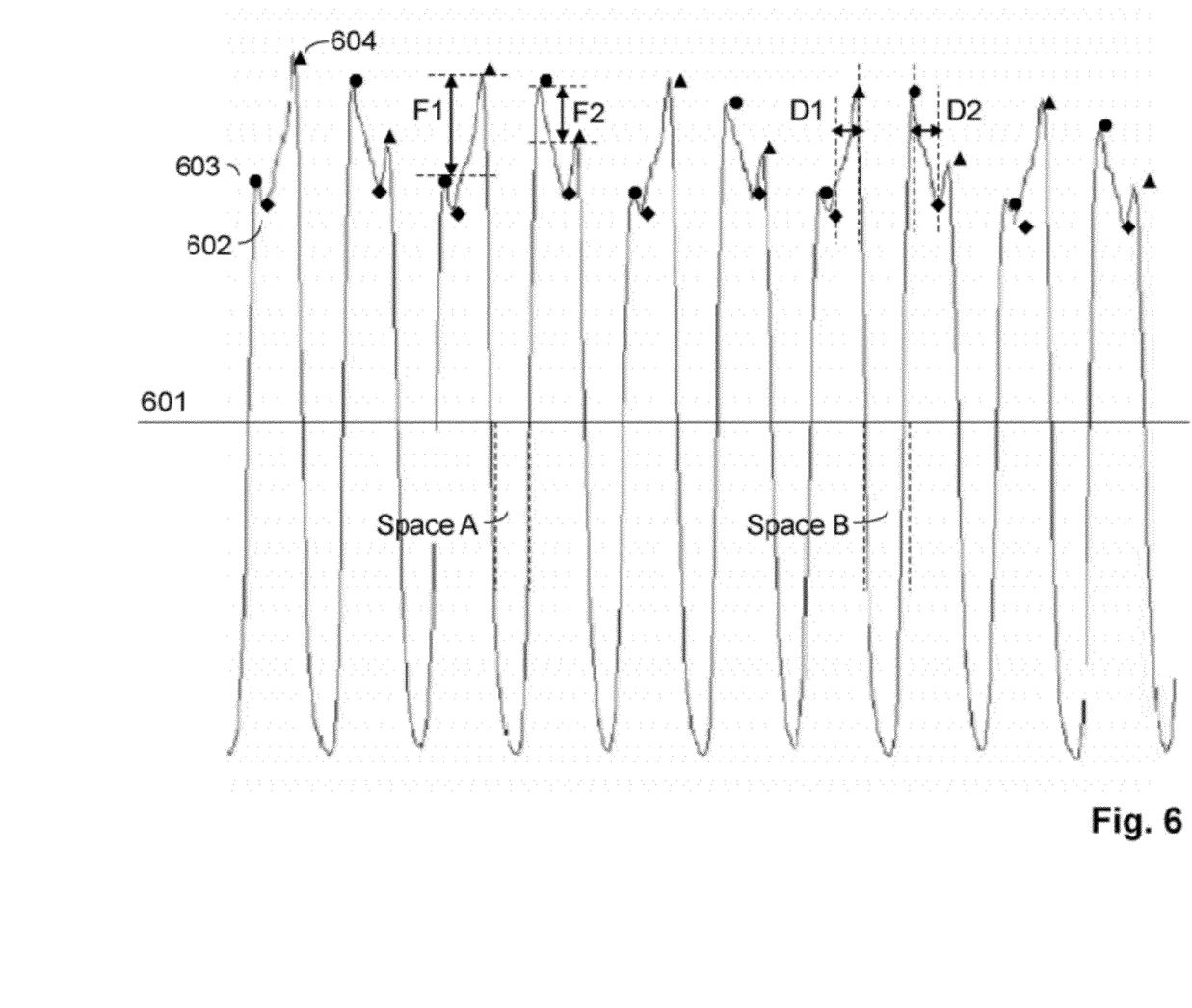
FIG. 6 illustrates examples of stage-indicative features derived from a one-dimensional profile in accordance with certain embodiments of the present invention.

Referring to FIG. 5, there is illustrated a flow-chart of a method for assessing stage-indicative features for a line-patterned structure in accordance with certain embodiments of the present invention. Upon obtaining (501) the one-dimensional profile, distinguishing (502) between lines and spaces is provided in accordance with a calculated mean value. Points of intersections of the one-dimensional profile and the mean value line identify (503) the end points for respective lines. As illustrated in FIGS. 4 and 6, each given line has a relatively dark portion in the middle corresponding to a flat part of the line, a narrow and bright portion corresponding to its sharp edge, and a relatively wide and bright portion corresponding to its slant edge. The process further includes finding in the one-dimensional profile central minimum points (504) and respective maximum (505) points to the left and to the right for the lines corresponding to spaces constituting the above sufficient amount of spaces. Calculating (506) examples of stage-indicative features is further detailed with reference to FIG. 6.

A mean value line is denoted in FIG. 6 as 601, central minimum points are denoted as 602, maximum points for the edges are denoted as 603 for the left edge and as 604 for the right edge.

FIG. 6 illustrates calculating the pair of values (F1 and F2) of the feature indicating relative edge brightness of lines at two sides of a given space (denoted as Space A). Value F1 is calculated as a difference in maximum brightness between the close and far edges of the line to the left of the given space. Likewise, value F2 is calculated for the line to the right of the given space. If there is no line on a side of a certain space, the respective space is not considered in the classification decision.

F1=MaxLeftNear−MaxLeftFar

F2=MaxRightNear−MaxRightFar

FIG. 6 further illustrates calculating the pair of values (D1 and D2) of the feature indicating width of line edges adjacent to a given space (denoted as Space B). Value D1 is calculated as a width between a central minimum point and a right maximum point of the line to the left of the given space. Likewise, value D2 is calculated for the line to the right of the given space. If there is no line on a side of a certain space, the respective space is not considered in the classification decision.

Figure 7:
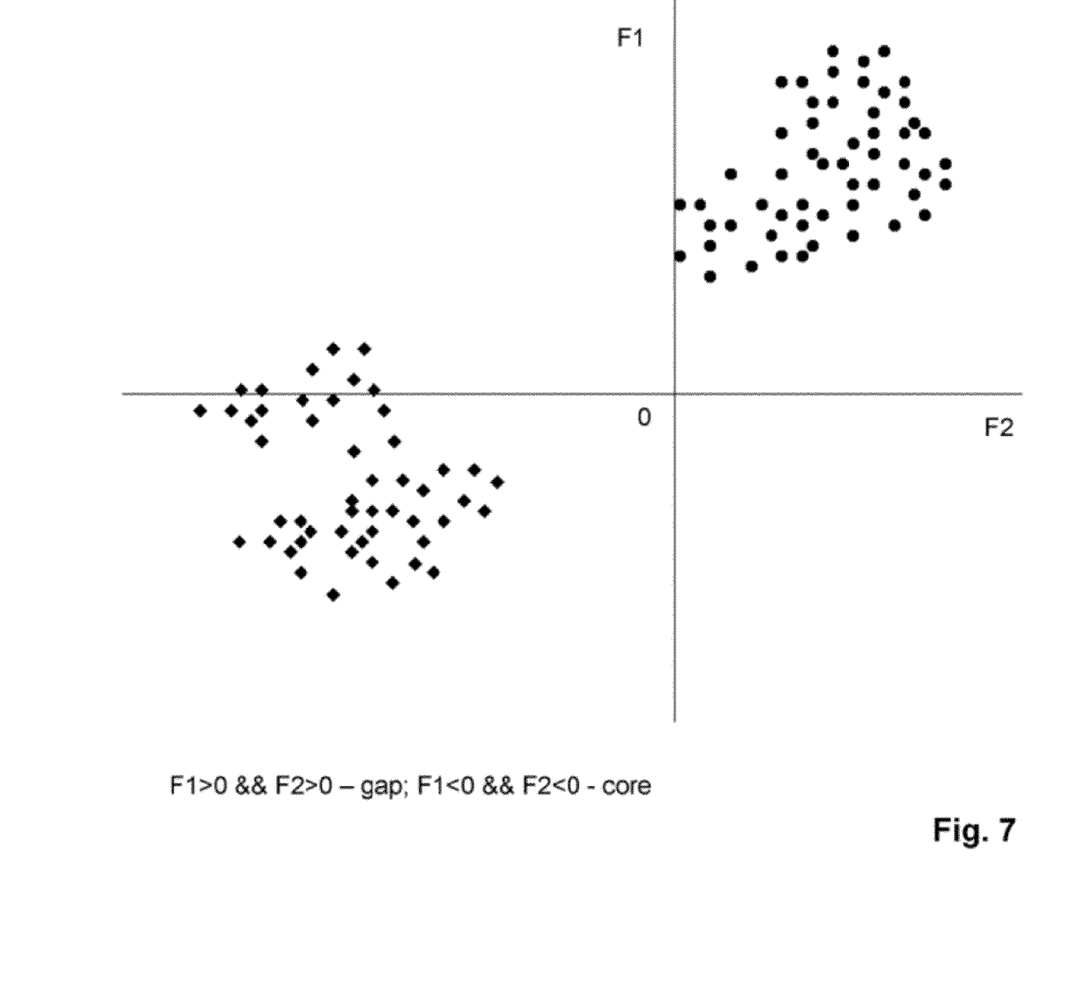
FIG. 7 illustrates F1 and F2 values calculated in accordance with certain embodiments of the present invention for an example image.

FIG. 7 illustrates F1 and F2 values calculated in accordance with certain embodiments of the present invention for an example image. The illustrated squares correspond to the values calculated for odd spaces and circles correspond to the values calculated for even spaces. Each square and circle is characterized by a respective F1 value (axis Y) and F2 value (axis X). Negative F1 and F2 values indicate core spaces, and positive F1 and F2 values indicate gap spaces. Accordingly, line edges adjacent to the core spaces result from the core material removal (215) while line edges adjacent to the gap spaces result from spacer etch (214). As illustrated in FIG. 7, the obtained results are successfully separated and enable classification decisions, namely, even spaces in the example image are core spaces and odd spaces are gap spaces.

Figure 8:
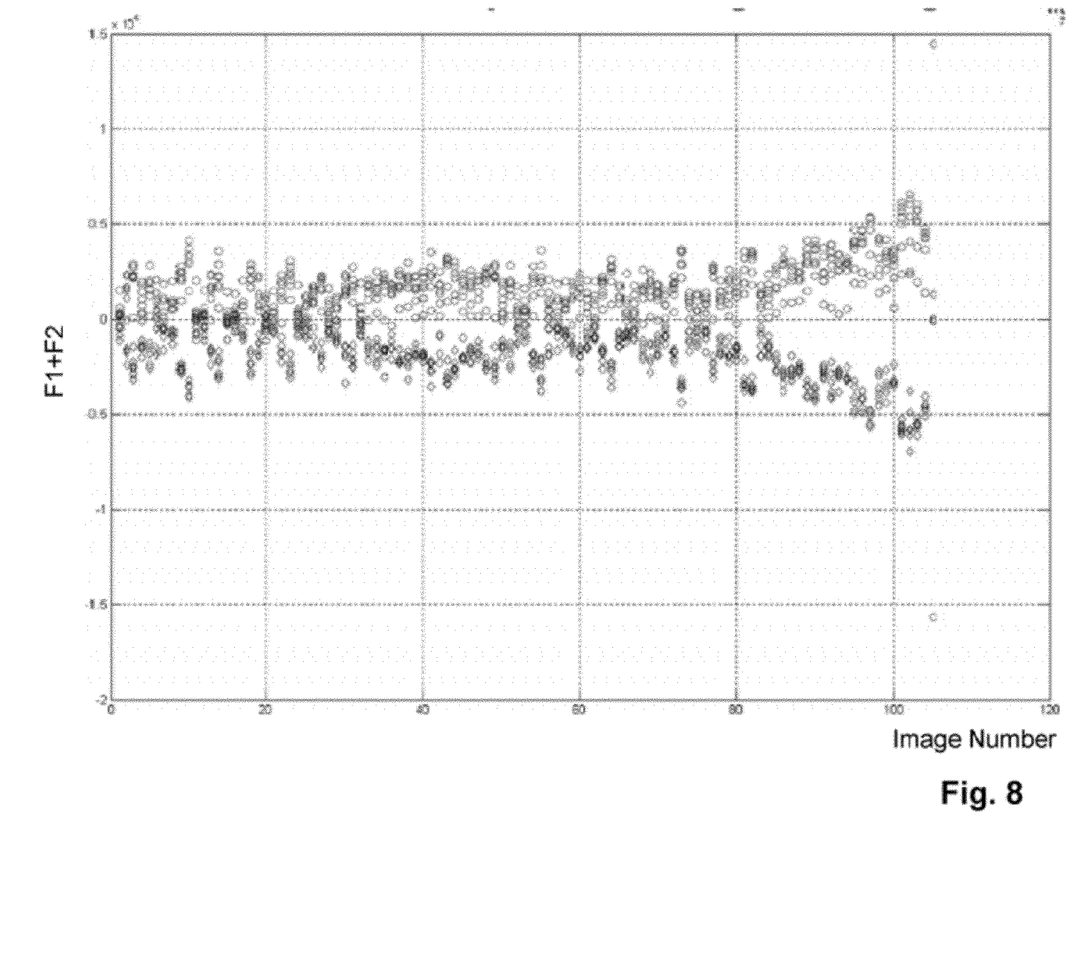
FIG. 8 illustrates F1 and F2 values calculated in accordance with certain embodiments of the present invention for a set of example images.

FIG. 8 illustrates F1 and F2 values calculated in accordance with certain embodiments of the present invention for a set of example images. The illustrated squares correspond to the values calculated for odd spaces and circles correspond to the values calculated for even spaces. Each square and circle is characterized by a respective F1+F2 value (axis Y) and a serial number of a respective image (axis X). As illustrated, the obtained results are successfully separated and enable classification decisions between the similar structural elements stemming from different origins.

Figure 9:
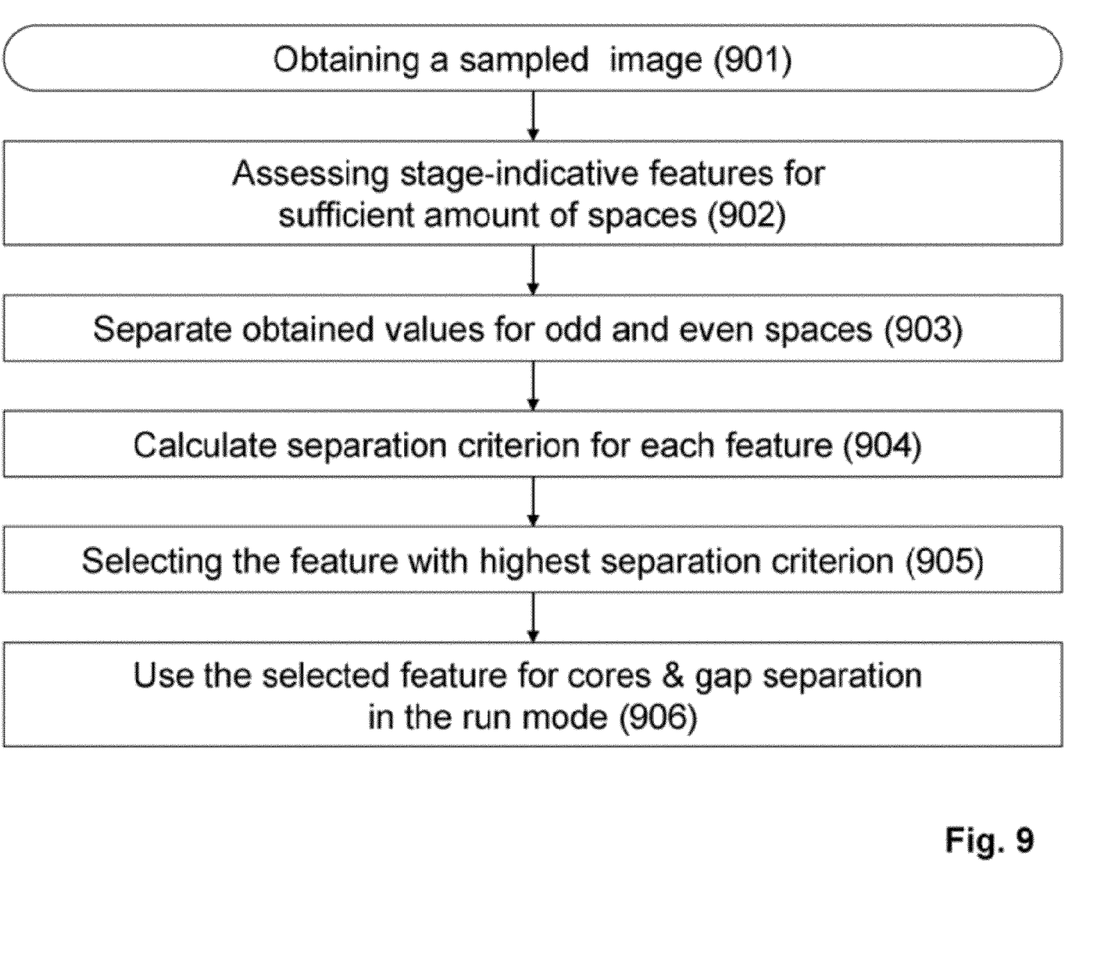
FIG. 9 is a flow-chart for a method of selecting a feature for further classification decision.

Referring to FIG. 9, there is illustrated a flow-chart of a method of selecting features for further classification decisions. In certain embodiments of the invention the selection of features may be provided during a learning mode of a metrology process, the features to be further used during a run mode of the manufacturing process. Upon obtaining (901) a sampled image, all spaces constituting the sufficient number are assessed (902) with respect to the different stage-indicative features (e.g., F1& F2, D1&D2, mean space brightness B, etc.). The obtained values are separated (903) to correspond to groups of similar structural elements stemming from different origins (e.g., groups of odd and even spaces), and used for calculating (904) a separation criterion for each feature. By way of non-limiting example, the separation criterion may be calculated as Fisher criterion Fc. Fisher criteria for the features F1& F2, D1&D2 and mean space brightness B may be respectively calculated as:

$$Fc_f = \frac{|\text{mean}(f1(\text{odd}) + f2(\text{odd})) - \text{mean}(f1(\text{even}) + f2(\text{even}))|}{\sqrt{\text{var}(f1(\text{odd}) + f2(\text{odd})) + \text{var}(f1(\text{even}) + f2(\text{even}))}}$$

$$Fc_d = \frac{|\text{mean}(d1(\text{odd}) + d2(\text{odd})) - \text{mean}(d1(\text{even}) + d2(\text{even}))|}{\sqrt{\text{var}(d1(\text{odd}) + d2(\text{odd})) + \text{var}(d1(\text{even}) + d2(\text{even}))}}$$

-continued $$Fc_b = \frac{|\text{mean}(b(\text{odd})) - \text{mean}(b(\text{even}))|}{\sqrt{\text{var}(b(\text{odd})) + \text{var}(b(\text{even}))}}$$

The feature is considered as enabling successful separation of similar structural elements of different origin to different groups if the respective separation criterion exceeds a pre-defined threshold (e.g., Fc>2).

Alternatively or additionally, the separation criterion may be calculated as Student's T-test for samples of unequal size with unequal variances or otherwise.

Optionally, the separation criteria may be also used for estimating accuracy of the classification decision.

In accordance with certain embodiments of the present invention, separation provided by different stage-indicative features is tested individually for each given feature, since the separation criterion for different features may vary depending on different stages of the manufacturing process. Optionally, the separation criterion may be calculated to a vector characterized by several stage-indicative features.

Upon calculating the separation criteria and providing the evaluation of distinctiveness of the features for the sampled image, there is selected (905) the stage-indicative feature with the highest separation criterion. This feature is selected as the stage-indicative feature to be used for further classifying (906) similar structural elements at the corresponding manufacturing stage in the run mode.

If evaluation of distinctiveness has been provided for an image obtained in the run manufacturing mode, any of the features matching the separation criterion may be used for a classification decision. Optionally, a classification decision (and/or estimation of its accuracy) may be made based on comparing assessment results obtained for several features matching the separation criterion.

Among the advantages of certain embodiments of the present invention is enabling CD measurements with awareness of certain similar structural elements originating from different manufacturing stages, and appropriate adjustment of respectively involved parameters.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the present invention.

It will also be understood that the system according to the invention may be a suitably programmed computer. Likewise, the invention contemplates a computer program being readable by a computer for executing the method of the invention. The invention further contemplates a machine-readable memory tangibly embodying a program of instructions executable by the machine for executing the method of the invention.

Those skilled in the art will readily appreciate that various modifications and changes can be applied to the embodiments of the invention as hereinbefore described without departing from its scope, defined in and by the appended claims.

What is claimed is:

1. For use in conjunction with critical dimensions metrology of a semiconductor structure comprising a plurality of similar structural elements, said plurality of similar structural elements including at least a first group and a second group of similar structural elements, each group of similar structural elements originating from a different manufacturing stage, a computerized method of classifying the similar structural elements, the method comprising:
    obtaining a two-dimensional image of the semiconductor structure, said image comprising a plurality of similar two-dimensional image elements corresponding to said plurality of similar structural elements;
    identifying a sufficient number of structural elements belonging to the first group and a sufficient number of structural elements belonging to the second group;
    assessing to each identified structural element within said sufficient number of structural elements in the first group and in the second group one or more features associated with structural elements located adjacent to each of the identified structural elements that are indicative of a respective manufacturing stage;
    deriving, from the obtained two-dimensional image, values for the one or more features, thus giving rise to assessment results; and
    using said assessment results for a classification decision related to manufacturing stages and respectively originating therefrom structural elements in the first group and in the second group of similar structural elements.

2. The method of claim 1 wherein respective pairs of similar structural elements from the first group of similar structural elements and the second group of similar structural elements are selected from a group comprising:
    odd spaces and even spaces formed between periodic lines in a line-patterned structure wherein odd spaces and even spaces originate from different manufacturing stages in a double-exposure double patterning manufacturing process; and
    odd lines and even lines in a line-patterned structure, wherein odd lines and even lines originate from different manufacturing stages in a double-exposure double patterning manufacturing process.

3. The method of claim 1 wherein said similar structural elements are periodic lines in a line-patterned structure, and wherein edges of any said periodic lines originate from different manufacturing stages.

4. The method of claim 1 wherein, for a line-patterned structure comprising a plurality of periodic lines and a plurality of periodic spaces therebetween, the features indicative of a respective manufacturing stage are derived from a one-dimensional profile derived from the obtained image and are characterized by one or more parameters selected from a group comprising: average space brightness, absolute brightness of one or more edges of lines adjacent to the space, relative brightness of one or more edges of lines adjacent to the space, average brightness of one or more edges of lines adjacent to the space, width of one or more edges of lines adjacent to the space, a ratio between brightness and width, shapes of edge descriptors, edge profile roughness, and combinations thereof.

5. The method of claim 1 further comprising evaluating distinctiveness of said one or more features for a classification decision, said evaluation provided in accordance with a separation criterion.

6. The method of claim 1 further comprising a learn manufacturing mode and a run manufacturing mode, the learn manufacturing mode comprising:
    obtaining a sample image corresponding to a certain manufacturing stage; and
    selecting among said features a feature enabling a highest distinctiveness; said feature to be used for assessing to similar structural elements a corresponding manufacturing stage in the run manufacturing mode.

7. The method of claim 1 wherein values of said one or more features indicative of the respective manufacturing stage are derived from a one-dimensional profile indicative of one or more parameters of the semiconductor structure and derived from the obtained image.

8. For use in conjunction with critical dimensions metrology of a semiconductor structure comprising a plurality of similar structural elements, said plurality of similar structural elements including at least a first group and a second group of similar structural elements, each group of similar structural elements originating from a different manufacturing stage, a computerized method of classifying the similar structural elements, the method comprising:
  obtaining an image of the semiconductor structure;
  identifying a sufficient amount of structural elements belonging to the first group and sufficient amount of structural elements belonging to the second group;
  assessing to each given structural element within said sufficient amount of elements in the first group and in the second group one or more features indicative of a respective manufacturing stage, wherein values of the respective features are derived from a one-dimensional profile indicative of one or more parameters of the semiconductor structure, said profile derived from the obtained image;
  using said assessment results for a classification decision related to manufacturing stages and respectively originating therefrom structural elements in the first group and in the second group of similar structural elements;
  wherein, for a line-patterned structure comprising a plurality of periodic lines and a plurality of periodic spaces therebetween, assessing said one or more features to a given space comprises calculating a pair of values, F1 and F2, of a feature indicating relative edge brightness of lines at two sides of a given space, and wherein value F1 is calculated as a difference in maximum brightness between close and far edges of the line to the left of the given space and value F2 is calculated as a difference in maximum brightness between close and far edges of the line to the right of the given space.

9. For use in conjunction with critical dimensions metrology of a semiconductor structure comprising a plurality of similar structural elements, said plurality of similar structural elements including at least a first group and a second group of similar structural elements, each group of similar structural elements originating from a different manufacturing stage, a computerized method of classifying the similar structural elements, the method comprising:
  obtaining an image of the semiconductor structure;
  identifying sufficient amount of structural elements belonging to the first group and sufficient amount of structural elements belonging to the second group;
  assessing to each given structural element within said sufficient amount of elements in the first group and in the second group one or more features indicative of a respective manufacturing stage, wherein values of the respective features are derived from a one-dimensional profile indicative of one or more parameters of the semiconductor structure, said profile derived from the obtained image;
  using said assessment results for a classification decision related to manufacturing stages and respectively originating therefrom structural elements in the first group and in the second group of similar structural elements;
  wherein, for a line-patterned structure comprising a plurality of periodic lines and a plurality of periodic spaces therebetween, assessing said one or more features to a given space comprises calculating a pair of values, D1 and D2, of a feature indicating width of line edges adjacent to a given space; and wherein value D1 is calculated as a width between a central minimum point and a right maximum point of a line to the left of the given space, value D2 is calculated as a width between a central minimum point and a right maximum point for a line to the right of the given space, said points positioned on a one-dimensional profile indicative of one or more parameters of the semiconductor structure and derived from the obtained image.

10. A CD-metrology system comprising an image unit operatively coupled to a processing unit, wherein
  the image unit is configured to obtain a two-dimensional image of a semiconductor structure comprising a plurality of similar structural elements, said plurality of similar structural elements comprising at least a first group and a second group of similar structural elements, each group originating from a different manufacturing stage, said image comprising a plurality of similar two-dimensional image elements corresponding to said plurality of similar structural elements, and
  the processing unit is configured:
    to identify a sufficient number of structural elements belonging to the first group and a sufficient number of structural elements belonging to the second group;
    to assess to each identified structural element within said sufficient number of structural elements in the first group and in the second group one or more features associated with structural elements located adjacent to each of the identified structural elements that are indicative of respective manufacturing stages;
    to derive, from the obtained two-dimensional image, values for the one or more features; and
    to use the values for a classification decision related to manufacturing stages and respectively originating therefrom structural elements in the first group and in the second group of similar structural elements.

11. The system of claim 10 wherein said first group of similar structural elements is odd spaces and said second group of similar structural elements is even spaces formed between periodic lines in a line-patterned structure, and wherein odd spaces and even spaces originate from different manufacturing stages in a double-exposure double patterning manufacturing process.

12. The system of claim 10 wherein said similar structural elements are periodic lines in a line-patterned structure, and wherein edges of any of said periodic lines originate from different manufacturing stages.

13. The system of claim 12 wherein opposite edges of any of said given lines originate from different structure interfaces obtained in a double patterning manufacturing process.

14. The system of claim 10 wherein said first group of similar structural elements is odd lines and said second group of similar structural elements is even lines in a line-patterned structure and wherein odd lines and even lines originate from different manufacturing stages in a double-exposure double patterning manufacturing process.

15. The system of claim 10 wherein, for a line-patterned structure comprising a plurality of periodic lines and a plurality of periodic spaces therebetween, the features indicative of respective manufacturing stages are derived from a one-dimensional profile derived from the obtained image and are characterized by one or more parameters selected from a group comprising: average space brightness, absolute brightness of one or more edges of lines adjacent to the space, relative brightness of one or more edges of lines adjacent to the space, average brightness of one or more edges of lines adjacent to the space, width of one or more edges of lines adjacent to the space, a ratio between brightness and width, shapes of edge descriptors, edge profile roughness, and combinations thereof.

16. The system of claim 10 wherein the processing unit is further configured to evaluate distinctiveness of said one or more features for the classification decision, said evaluation provided in accordance with a separation criterion.

17. The system of claim 10 further configured to operate in a learn manufacturing mode and a run manufacturing mode, wherein the imaging unit is further configured for the learn manufacturing mode to obtain a sample image corresponding to a certain manufacturing stage; and the processing unit is further configured for the learn manufacturing mode to select among said features a feature enabling a highest distinctiveness, said feature to be used for assessing to similar structural elements corresponding manufacturing stages in the run manufacturing mode.

18. The system of claim 10 wherein values of said one or more features indicative of respective manufacturing stages are derived from a one-dimensional profile indicative of one or more parameters of the semiconductor structure and derived from the obtained image.

19. An image processing tool configured to operate in conjunction with a CD metrology system and comprising:
   means to identify in an obtained two-dimensional image of a semiconductor structure comprising a plurality of similar structural elements comprising at least a first group and a second group of similar structural elements, each group originating from a different manufacturing stage, a sufficient number of structural elements belonging to the first group and a sufficient number of structural elements belonging to the second group, wherein said image comprises a plurality of similar two-dimensional image elements corresponding to said plurality of similar structural elements;
   means to assess to each identified structural element within said sufficient number of structural elements in the first group and in the second group one or more features associated with structural elements located adjacent to each of the identified structural elements that are indicative of respective manufacturing stages;
   means to derive, from the obtained two-dimensional image, values for the one or more features; and
   means to use the values for a classification decision related to manufacturing stages and respectively originating therefrom structural elements in the first group and in the second group of similar structural elements.

20. A computer program product comprising a non-transitory computer readable medium storing computer readable program code for a computer operating in conjunction with a CD metrology system, the computer program product comprising:
   computer readable program code for causing the computer to identify in an obtained two-dimensional image of a semiconductor structure comprising a plurality of similar structural elements comprising at least a first group and a second group of similar structural elements, each group originating from a different manufacturing stage, a sufficient number of structural elements belonging to the first group and a sufficient number of structural elements belonging to the second group, wherein said image comprises a plurality of similar two-dimensional image elements corresponding to said plurality of similar structural elements;
   computer readable program code for causing the computer to assess to each identified structural element within said sufficient number of structural elements in the first group and in the second group one or more features associated with structural elements located adjacent to each of the identified structural elements that are indicative of respective manufacturing stages;
   computer readable program code for causing the computer to derive, from the obtained two-dimensional image, values for the one or more features; and
   computer readable program code for causing the computer to use the values for a classification decision related to manufacturing stages and respectively originating therefrom structural elements in the first group and in the second group of similar structural elements.

21. A CD-metrology system comprising an image unit operatively coupled to a processing unit, wherein
   the image unit is configured to obtain an image of a semiconductor structure comprising a plurality of similar structural elements, said plurality of similar structural elements comprising at least a first group and a second group of similar structural elements, each group originating from a different manufacturing stage, and
   the processing unit is configured:
      to identify a sufficient amount of structural elements belonging to the first group and a sufficient amount of structural elements belonging to the second group;
      to assess to each given structural element within said sufficient amount of elements in the first group and in the second group one or more features indicative of respective manufacturing stage, wherein values of the respective features are derived from a one-dimensional profile indicative of one or more parameters of the semiconductor structure, said profile derived from the obtained image; and
      to use the results of assessing for a classification decision related to manufacturing stages and respectively originating therefrom structural elements in the first group and in the second group of similar structural elements,
   wherein, for a line-patterned structure comprising a plurality of periodical lines and a plurality of periodical spaces therebetween, assessing said one or more features to a given space comprises calculating a pair of values F1 and F2 of a feature indicating relative edge brightness of lines at two sides of a given space, and wherein value F1 is calculated as a difference in maximum brightness between the close and far edges of the line to the left of the given space and value F2 is calculated as a difference in maximum brightness between the close and far edges of the line to the right of the given space.

22. A CD-metrology system comprising an image unit operatively coupled to a processing unit, wherein
   the image unit is configured to obtain an image of a semiconductor structure comprising a plurality of similar structural elements, said plurality of similar structural elements comprising at least a first group and a second group of similar structural elements, each group originating from a different manufacturing stage, and
   the processing unit is configured:
      to identify a sufficient amount of structural elements belonging to the first group and a sufficient amount of structural elements belonging to the second group;

to assess to each given structural element within said sufficient amount of elements in the first group and in the second group one or more features indicative of respective manufacturing stage, wherein values of the respective features are derived from a one-dimensional profile indicative of one or more parameters of the semiconductor structure, said profile derived from the obtained image; and to use the results of assessing for a classification decision related to manufacturing stages and respectively originating therefrom structural elements in the first group and in the second group of similar structural elements, wherein, for a line-patterned structure comprising a plurality of periodical lines and a plurality of periodical spaces therebetween, assessing said one or more features to a given space comprises calculating a pair of values D1 and D2 of a feature indicating width of line edges adjacent to a given space; and wherein value D1 is calculated as a width between central minimum point and right maximum point of the line to the left of the given space, value D2 is calculated as a width between central minimum point and right maximum point for the line to the right of the given space, said points are positioned on a one-dimensional profile indicative of one or more parameters of the semiconductor structure and derived from the obtained image.

\* \* \* \* \*